(12) United States Patent
Rowe et al.

(10) Patent No.: US 6,375,811 B1
(45) Date of Patent: Apr. 23, 2002

(54) FLEXIBLE, HIGHLY DURABLE, TRANSPARENT OPTICAL COATINGS

(75) Inventors: James Malon Rowe, Torrance; John W. Stephenson, Whittier, both of CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/373,126

(22) Filed: Aug. 12, 1999

(51) Int. Cl.[7] .......................... C23C 14/34; C23C 16/00
(52) U.S. Cl. ............................. 204/192.26; 204/192.12
(58) Field of Search ................ 427/488, 489, 427/490, 491, 162, 571; 204/192.12, 192.15, 192.26; 428/336

(56) References Cited

U.S. PATENT DOCUMENTS

| | | | |
|---|---|---|---|
| 3,822,928 A | | 7/1974 | Smolinsky et al. ........... 350/96 |
| 4,013,532 A | * | 3/1977 | Cormia et al. ......... 204/192.15 |
| 4,312,575 A | | 1/1982 | Peyman et al. ......... 351/160 H |
| 4,390,595 A | | 6/1983 | Yamagishi ................. 428/446 |
| 4,479,982 A | | 10/1984 | Nilsson et al. ................. 427/41 |
| 4,632,844 A | | 12/1986 | Yanagihara et al. .......... 427/38 |
| 4,687,679 A | | 8/1987 | Beale .......................... 427/38 |
| 4,728,564 A | * | 3/1988 | Akagi et al. ................ 428/336 |
| 4,755,426 A | * | 7/1988 | Kokai et al. ................ 427/489 |
| 4,830,873 A | | 5/1989 | Benz et al. ................... 427/35 |
| 4,921,724 A | * | 5/1990 | Hubert et al. ............... 427/571 |
| 5,217,749 A | | 6/1993 | Denton et al. .............. 427/488 |
| 5,814,367 A | * | 9/1998 | Hubbard et al. ............ 427/162 |

* cited by examiner

*Primary Examiner*—Nam Nguyen
*Assistant Examiner*—Gregg Cantelmo
(74) *Attorney, Agent, or Firm*—Terry J. Anderson; Karl J. Hoch, Jr.

(57) ABSTRACT

Optical coatings and methods of fabricating the same. According to a preferred embodiment, the optical coatings comprise polymeric films formed from the disassociation of chemical products from a gaseous hydrocarbon in plasma. The disassociation process is performed in low-pressure environment and without radio frequency substrate bias. The resultant optical coatings have superior stability, durability and flexibility and may be utilized on highly flexible substrates. The coatings of the present invention can additionally be utilized for multi-layer optical designs and further, may be doped with a polar material to thus cause the coating to possess a desired index of refraction.

6 Claims, 1 Drawing Sheet

FLEXIBLE, HIGHLY DURABLE, TRANSPARENT OPTICAL COATINGS

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

Optical coatings are well-known in the art. In this regard, optical coatings are frequently utilized to enhance performance of optical systems. Moreover, such coatings can be specially designed and fabricated to produce greater accuracy and reproducibility as may be needed for a given application. In this respect, such films can serve as mechanical and/or chemical protective barriers, as disclosed in U.S. Pat. No. 4,632,844 to Yanagihara, and may further have high transmissivity in the infrared spectral region, as disclosed in U.S. Pat. No. 5,830,873 to Benz et al.

Typically, optical coatings are formed by vacuum deposition upon the substrate sought to be coated. Advantageously, by depositing such materials under vacuum conditions, there thus may be controlled the purity, deposition rate and micro-structure of the resultant optical coating. In fact, such deposition processes have been so refined that precise control of coating thickness, as well as the refractive index possessed thereby, can be achieved and consistently reproduced. For example, it has long been known that glow discharge and organic vapor or gas can be used to produce thin, optically transparent films, as disclosed in U.S. Pat. No. 3,822,922 Smolinski et al. Along these lines, it is also well-known that changes and the parameters of such deposition processes can produce modest changes in infractive index, as disclosed in U.S. Pat. No. 5,217,749 to Denton et al.

Moreover, due to the control of thickness and index of refraction that may be attained via vacuum deposition, multi-layer optical coatings can be fabricated to optimize reflection, transmission and absorption of light. It is further known in the art to construct multi-spectral coatings, although it is recognized that as spectral requirements increase, coating complexity increases. Along these lines, infrared multi-spectral coatings with 50 to 100 layers totalling 10 to 20 microns thick are not uncommon.

Generally, materials utilized for optical coatings do not possess high flexibility and most prior art coating systems have been limited in applications involving hard, stable optical substrates. In this respect, traditional optical coating materials comprise metals, semi-conductors, oxides and fluorides. While some degree of flexibility is attainable when such materials are very thin, optically useful thicknesses are generally not sufficiently flexible. In the case of metallic reflectors, however, it is known that some metals can be deposited thin enough to provide flexibility and high reflectance, although such class of coating materials is considered the exception as opposed to the general rule.

Along these lines, it is known that the flexibility properties of optical coatings are compromised at the expense of the reflectivity of such coating materials. Although otherwise well-suited, metallic reflectors are negated in some applications by other requirements or considerations, such as spectral filtering and/or microwave remittance, for example, which, as a consequence, require multi-layer dielectric design. Unfortunately, such dielectric reflector and multi-spectral coatings require much thicker layers and are not considered flexible, as would otherwise be desired.

As such, there is a considerable need in the art for fabrication processes by which optical coatings can be formed having sufficient durability concerning a variety of aspects, and in particular, material friability, hardness, internal stress and adhesion. Such durability concerns are further affected by the properties of the coating substrate. With respect to the latter, it is known in the art that optical coating durability plays less of a consideration when hard, stable substrates are utilized. Flexible substrates, on the other hand, are not as forgiving and, as such, prevent traditional optical coatings from achieving sufficient durability when applied thereto.

There is additionally a substantial need in the art for a method of fabricating optical coatings that are highly durable and are capable of subsisting on flexible substrates as well as a need for a method of fabricating optical coatings that, in addition to possessing a high degree of durability, further possesses excellent adhesion properties and can be selectively modified to produce an optical coating having a desired index of refraction.

Still further, there is a need for processes for fabricating optical coatings that may be readily and easily practiced, are inexpensive to deploy, can be utilized to form multi-layer coatings and can be utilized for a broad range of applications involving light having a wave length falling within the spectral range of visible to long-wave infrared light.

BRIEF SUMMARY OF THE INVENTION

The present invention specifically addresses and alleviates the above-identified deficiencies in the art. In this regard, the present invention is directed to optical coatings and methods of forming optical coatings that have superior durability than prior art coatings and, in particular, may be applied to and effectively utilized with highly flexible substrates. According to the preferred embodiment, the coatings of the present invention comprise thin polymeric films formed-by the disassociation of chemical subcomponents from gaseous hydrocarbons in plasma which possess a low index of refraction, as well as a sufficiently low extinction coefficient. The disassociation process is conducted under low pressure and without radio frequency substrate bias, similar to processes utilized in depositing diamond-like-carbon.

The resultant coatings may be utilized on a variety of substrates, including highly flexible substrates such as urethane. The coatings may further be utilized in applications involving light ranging from visible to long-wave infrared. Such optical coatings and methods of fabricating the same may further be utilized to form coatings having a specified thickness sufficient to realize multi-layer optical designs. To the extent it is desired to cause the coating formed to possess index contrasts, as may be required for multi-layer optical designs, the polymeric film formed from the disassociation of the gaseous hydrocarbon in plasma may be doped with a polar material, such as germanium or silicon, which consequently raises the index of refraction for the optical coating. According to the preferred embodiment, such polymer material is sputter deposited in the growing polymer as the same is deposited upon the optical substrate.

It is therefore an object of the present invention to provide optical coatings and methods of fabricating the same that are highly durable, stable and exceptionally flexible such that the same may be utilized on highly flexible substrates.

Another object of the present invention is to provide optical coatings and methods of fabricating the same that, in addition to having superior durability and flexibility, may be utilized for multi-layer optical designs, and may be further formed to have a desired index of refraction.

Still further objects of the present invention include providing optical coatings and methods of manufacturing the same that may be readily and easily formed by utilizing existing, commercially available materials, are efficient to fabricate, may be utilized on any of a variety of substrates, and may be utilized for any of a variety of applications utilizing light ranging from visible through long-wave infrared.

BRIEF DESCRIPTION OF THE SEVERAL VIEWS OF THE DRAWING

These, as well as other features of the present invention will become more apparent upon reference to the drawings wherein.

DETAILED DESCRIPTION OF THE INVENTION

Figure 1:
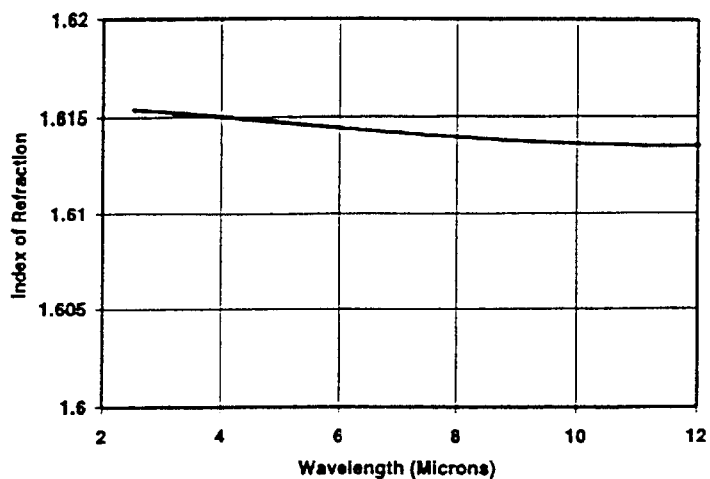
FIG. 1 is a plot comparing the index of refraction of an optical coating formed according to the present invention relative the wave length of light, measured in microns, reflected thereagainst as determined from transmission data on germanium.

The detailed description as set forth below in connection with the appended drawings is intended as a description of the presently preferred embodiments of the invention, and is not intended to represent the only form in which the present invention may be constructed or utilized. The description sets forth the functions and sequences of steps for constructing and operating the invention in connection with the illustrated embodiments. It is understood, however, that the same or equivalent functions and sequences may be accomplished by different embodiments and that they are also intended to be encompassed within the scope of this invention.

The present invention is directed to novel optical coatings and methods of fabricating the same that advantageously possess greater stability and durability than prior art coatings. In this respect, the optical coatings of the present invention achieve superior flexibility and may be utilized on highly flexible substrates, unlike traditional optical coatings.

According to a preferred embodiment, the optical coatings of the present invention comprise thin polymeric films that are formed by the disassociation products produced from a gaseous hydrocarbon in plasma. Such a disassociation process is conducted in a low-pressure environment and without radio frequency substrate bias. As will be appreciated by those skilled in the art, the deposition process of the present invention is in essence a novel extension of those processes utilized to deposit diamond-like-carbon (DLC).

The optical coatings of the present invention are caused to be formed upon a desired substrate within a vacuum chamber. Preferably, the pressure within the vacuum chamber ranges from 10 to 20 microns, with 15 microns being most preferred. A radio frequency power is simultaneously applied to such substrate, and preferably ranges from 1.0 to 1.8 watts/cm$^2$, with a power of 1.4 watts/cm$^2$ being most preferred. As discussed above, however, no radio frequency bias is applied to the substrate during such deposition process.

As set forth in Table A, there is shown a comparison of the deposition conditions for DLC and polymeric optical coatings of the present invention, as formed according to the most preferred embodiment.

TABLE A

| Parameter | DLC | Polymeric Optical Coating |
|---|---|---|
| Chamber Pressure | 25 microns | 15 microns |
| RF Power | 0.5 Watts/cm$^2$ | 1.4 Watts/cm$^2$ |
| RF Bias | 0.2 Watts/cm$^2$ | none |

As will be recognized by those skilled in the art, the duration of the deposition process is proportional to the resultant thickness of the coating formed thereby, as may be necessary for a given application. Additionally, all steps of the process can be repeated as necessary to reach a desired end product.

As will be recognized by those skilled in the art, the processes of the present invention will consequently generate products from the disassociation of the gaseous hydrocarbon, and more particularly the monomer components thereof, that will ultimately caused to be formed upon a substrate a thin polymer film. Advantageously, the optical coatings of the present invention may be deposited upon any of a wide variety of substrates, including hard, stable substrates as well as highly flexible substrates. In this respect, such films have been successfully deposited upon substrates including microscope glass, germanium, urethane and at least one fluorocarbon.

Figure 2:
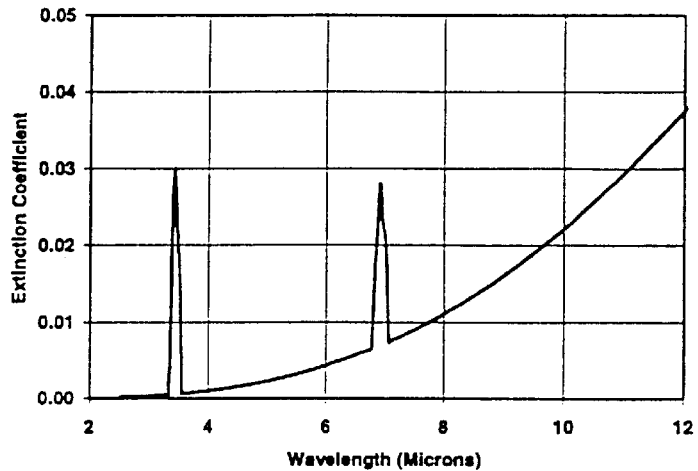
FIG. 2 is a plot comparing the extinction coefficient of the optical coatings formed according to the present invention relative the wave length of light, measured in microns, reflected thereagainst as determined from transmission data on germanium.

With respect to the optical characteristics of the films produced by the present invention, there is shown in FIG. 1 the index of refraction of such coating material as corresponds to wavelengths ranging from 2.5 to 12 microns. FIG. 2 illustrates the extinction coefficient of such coating material along the same wavelengths. As will be appreciated by those skilled in the art, such coatings are particularly well-suited for applications involving visible through long-wave infrared light.

Such coating has further demonstrated superior durability and has passed adhesion tape testing and erasure abrasion. Still further the optical coating formed pursuant to the present invention possesses superior flexibility and, when utilized upon flexible substrates, is capable of being folded with a very small radius, namely, less than 0.05 inches, with no apparent change.

In addition to the foregoing properties, the coatings and methods of fabricating the same according to the present invention may further be utilized to obtain index contrasts, as may be required for multi-layer optical designs. In such applications, the polymeric film derived from the disassociation products of gaseous hydrocarbons, would be doped with a polar material, such as germanium or silicon. In such embodiment such polar component is sputter deposited from respective one of the electrodes used to destain the discharge forming the growing polymeric film upon the substrate such that the plasma polymerization of the organic content of the sputter ambient is depositing polymer in the film at the same time. As will be recognized by those skilled in the art, such approach is different from prior art methods whereby films doped with a polar compound are typically formed of a combination of a polymer vapor mixed with a vapor with a polar compound, such as silver halide, as disclosed in U.S. Pat. No. 4,687,679 to Beal et al. In this respect, the method of the present invention advantageously is not restricted to materials in vapor form and that a sputtering target made from any solid material can be used as a source of component in film produced by the method of the present invention.

As a result, the method of the present invention preferable comprises applying a film that is an intimate mixture of the polymer and polar compounds. Indeed, the target (i.e., the discharge from the electrodes) is not restricted to being made of a single substance, but could itself be a mixture of both plasma with polar compound. As such, the deposited film advantageously behaves optically as though it were a homogenous material with the refractive index laying between that of the polymer and that of the polar compound.

As will be recognized by those skilled in the art, the introduction of such polar materials would consequently raise the index of refraction for the resultant coating. Indeed, the ratio of polymer to polar compound, and therefore refractive index, may thus be controlled by the respective amounts of such components in the sputtering ambient. As such, such films may be utilized in multiple layer optical interference coatings insofar as a high index contrast can be readily obtained. In this regard, the purposes herein, index contrast represent the ratio of the highest to lowest refractive index in a given coating. The ability to produce a specified arbitrary index value, as can be accomplished by the methods of the present invention, also simplifies the design in numerous cases. Presently, applicants have demonstrated refractive index values in the infrared spectral regions to range from 1.61 to 3.35. As will be appreciated by those skilled in the art, this represents an index contrast ratio of 2.08 or over 200% change than what is currently known in the prior art.

Figure 3:
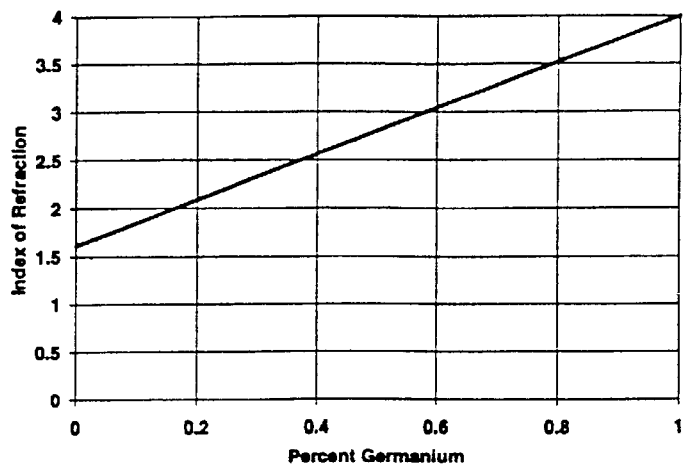
FIG. 3 is a plot depicting the index of refraction of an optical coating formed in conformance with the present invention as corresponds to the percentage of germanium doped therewith, the index of refraction being a function of the percentage of germanium doped in such coating.

As shown in FIG. 3, there is provided a theoretical estimate of the index of refraction of a coating material as formed by the methods of the present invention, if doped with germanium. In this regard, it is believed that a doping level 50germanium should yield an index of refraction of approximately 2.8. As will be appreciated by those skilled in the art, with an index range of 1.615 to 2.8, complex, multi-spectral, multi-layer optical designs can be realized.

Although the invention has been described herein with specific reference to a presently preferred embodiment thereof, it will be appreciated by those skilled in the art that various modifications, deletions, and alterations may be made to such preferred embodiment without departing from the spirit and scope of the invention. Accordingly, it is intended that all reasonably foreseeable additions, modifications, deletions and alterations be included within the scope of the invention as defined in the following claims.

What is claimed is:

1. A method of forming a polymeric optical coating upon a substrate comprising the steps of:
    a) providing a substrate, a deposition chamber and a gaseous hydrocarbon;
    b) placing said substrate within said chamber and introducing said gaseous hydrocarbon into said chamber;
    c) reducing the pressure within said chamber;
    d) applying an electric current to said chamber ranging from approximately 1.0 to 1.8 watts/cm$^2$ of said substrate such that said gaseous hydrocarbon is caused to disassociate into bi-products;
    e) forming a layer upon said substrate from the bi-products produced in step (d); and
    f) doping said layer formed in step (e) with a polar material selected from the group consisting of germanium and silicon for forming the optical coating.

2. The method of claim 1 wherein in step b), said pressure within said chamber is maintained at least 20 microns or lower.

3. The method of claim 2 wherein in step b), said pressure within said chamber is maintained at approximately 15 microns.

4. The method of claim 1 wherein said substrate is selected from the group consisting of glass, germanium, urethane and a fluorocarbon.

5. The method of claim 1 further comprising the step:
    g) repeating steps (b) through (f).

6. The method of claim 1 wherein in step (f) said polymer material is doped within said layer via sputter deposition.

* * * * *